(12) United States Patent
Koyama et al.

(10) Patent No.: US 6,787,904 B2
(45) Date of Patent: Sep. 7, 2004

(54) SEMICONDUCTOR INTEGRATED CIRCUIT DEVICE

(75) Inventors: Satoshi Koyama, Tokyo (JP); Tetsuo Sato, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/301,837

(22) Filed: Nov. 22, 2002

(65) Prior Publication Data

US 2003/0218248 A1 Nov. 27, 2003

(30) Foreign Application Priority Data

May 23, 2002 (JP) ........................................ 2002-149671

(51) Int. Cl.⁷ .............................................. H01L 23/48
(52) U.S. Cl. ...................................... 257/735; 257/692
(58) Field of Search ................................ 257/735, 692, 257/734, 693

(56) References Cited

FOREIGN PATENT DOCUMENTS

| JP | 6-188313 | 7/1994 |
|----|----------|--------|
| JP | 6-301197 | 10/1994 |

*Primary Examiner*—Roy Potter
(74) *Attorney, Agent, or Firm*—McDermott Will & Emery LLP

(57) ABSTRACT

A main circuit block and a sub-circuit block are located alongside of each other on a substrate of a semiconductor integrated circuit device. A plurality of bonding pads, which are connected to external leads of the device, are disposed around the main circuit block. A plurality of first wires are disposed extending from the main circuit block into space between the bonding pads. Each wire has a shape connectable to another wire, for example the wire has a tip having a portion perpendicular to the semiconductor substrate, or the wire has a tip having a cross-wire portion which intersect with an extended line of the wire. A plurality of second wires are extended from the sub-circuit block, and each electrically connected to one of the first wires.

15 Claims, 8 Drawing Sheets

SEMICONDUCTOR INTEGRATED CIRCUIT DEVICE

BACKGROUND OF THE INVENTION

1. Field of the Invention

The present invention relates to a semiconductor integrated circuit device having circuit blocks.

2. Background Art

Figure 19:
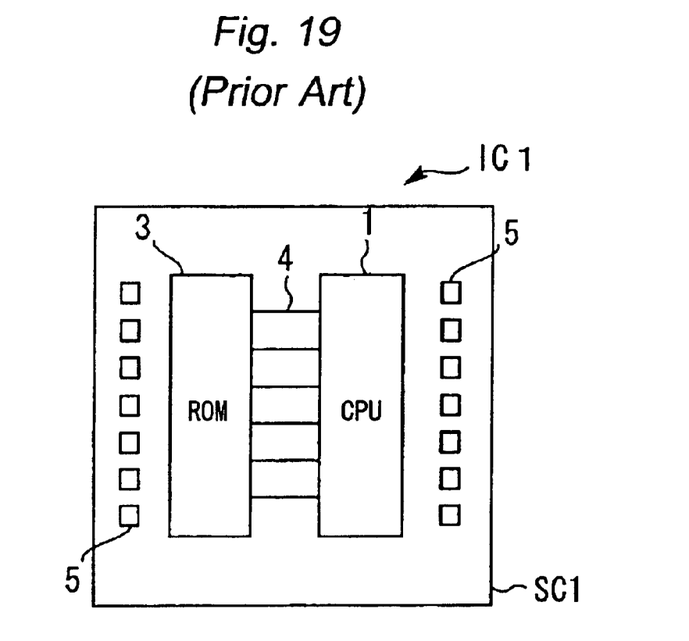
FIG. 19 shows a conventional type of semiconductor integrated circuit device.

FIG. 19 shows a conventional type of semiconductor integrated circuit device IC1 having circuit blocks. Specifically, the semiconductor integrated circuit device IC1 has two circuit blocks: a processing unit (CPU) 1 and a read-only memory (ROM) 3. The circuit blocks 1 and 3 are formed away from each other on a same semiconductor substrate SC1; the ROM 3 is formed to the left of the CPU 1. The CPU 1 and ROM 3 are electrically connected to each other by a plurality of wires 4 so that the CPU 1 can read data from the ROM 3 as necessary. A plurality of bonding pads 5 are disposed along the right and left edges of the semiconductor substrate SC1. The bonding pads 5 are electrically connected to the CPU 1 and the ROM 3 by the wiring layer on the semiconductor substrate SC1. The bonding pads 5 are also electrically connected to external leads (not shown) of the semiconductor integrated circuit device IC1 by bonding wires (not shown) so that the CPU 1 and the ROM 3 can receive and output signals through the external leads.

Figure 20:
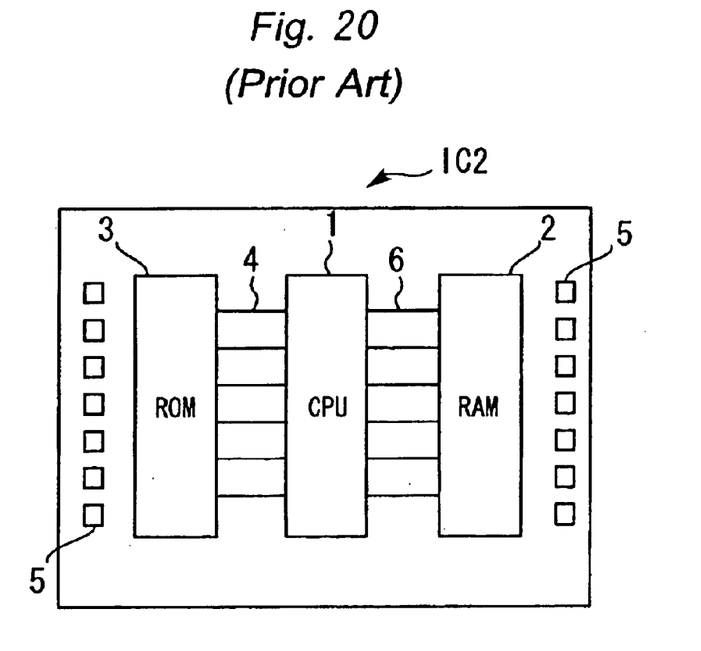
FIG. 20 shows another conventional type of semiconductor integrated circuit device.

FIG. 20 shows another conventional type of semiconductor integrated circuit device IC2 in which a random access memory (RAM) 2 is added to the structure of the semiconductor integrated circuit device IC1 of FIG. 19 as a third circuit block. In the semiconductor integrated circuit device IC2, the CPU 1 is formed at the center on a semiconductor substrate SC2 with the ROM 3 and the RAM 2 formed on its left and right sides respectively. The CPU 1 and the ROM 3 are electrically connected to each other by a plurality of wires 4, while the CPU 1 and the RAM 2 are electrically connected to each other by a plurality of wires 6. The CPU 1 retrieves information from the RAM 2 through the wires 6 as well as supplies information to the RAM 2 for storage, as necessary. The bonding pads 5 are disposed along the right and left edges of the semiconductor substrate SC2, as in FIG. 19, and used to exchange signals among the external leads, the CPU 1, the RAM 2, and the ROM 3.

Consider an attempt to produce the semiconductor integrated circuit device IC2 by modifying the semiconductor integrated circuit device IC1. With prior art techniques, it is difficult to add the RAM 2 (another circuit) to the semiconductor integrated circuit device IC1 with its CPU 1 and ROM 3 intact. Therefore, conventionally, the semiconductor integrated circuit device IC2 (the another type of semiconductor integrated circuit device) shown in FIG. 20 is newly produced separately from the semiconductor integrated circuit device IC1 shown in FIG. 19. This means that even though the semiconductor integrated circuit device IC2 shown in FIG. 20 includes the CPU 1 and the ROM 3 common to the semiconductor integrated circuit device IC1 shown in FIG. 19, the semiconductor integrated circuit device IC2 must be newly developed, designed, and manufactured independently of the semiconductor integrated circuit device IC1, incurring additional development and design cost.

SUMMARY OF THE INVENTION

The present invention has been devised to solve the above problems. It is, therefore, a first object of the present invention to propose an improved semiconductor integrated circuit device employing common circuit blocks in such a way that another type of semiconductor integrated circuit device can easily be manufactured from the improved semiconductor integrated circuit device.

A second object of the present invention is to propose an improved semiconductor integrated circuit device employing common circuit blocks in such a way that it can easily be manufactured from another type of semiconductor integrated circuit device.

According to one aspect of the present invention a semiconductor integrated circuit device comprises a semiconductor substrate; a circuit block on the substrate; a plurality of bonding pads disposed around the circuit block, being connected to external leads of the semiconductor integrated circuit device; and a plurality of wires extended from the circuit block into space between the bonding pads, each wire having a shape connectable to another wire.

When another circuit block is provided on the main surface of the semiconductor integrated circuit device, the plurality of wires which are extended from the circuit block into the space between the bonding pads can be connected to the wires of the another circuit block since the plurality of wires have such a shape that they are connectable to the wires of the another circuit block. With this arrangement, it is possible to dispose both a circuit block and another circuit block on a common semiconductor substrate with a distance therebetween and connect their wires together. Therefore, based on a semiconductor integrated circuit device having at least one circuit block, another type of semiconductor integrated circuit device can be easily manufactured by utilizing the circuit block, its bonding pads, and wires.

According to another aspect of the present invention a semiconductor integrated circuit device comprises a semiconductor substrate; a main circuit block and a sub-circuit block disposed alongside of each other with a distance therebetween on the substrate; a plurality of bonding pads disposed between the main circuit block and the sub-circuit block, being connected to external leads of the semiconductor integrated circuit device; a plurality of first wires extended in a direction from the main circuit block to the plurality of bonding pads, preferably extended from the main circuit block into space between the plurality of bonding pads; and a plurality of second wires extended from the sub-circuit block and each electrically connected to one of the first wires.

Since the plurality of bonding pads are disposed between the main circuit block and the sub-circuit block, the sub-circuit block can be disposed outside of the bonding pads around the main circuit block. With this arrangement, the sub-circuit block and the main circuit block can be easily formed alongside of each other on a same semiconductor substrate. As a result, it is possible to easily form a plurality of semiconductor integrated circuit devices of different types employing a common main circuit block. Furthermore, as described above, the plurality of first wires are extended in a direction from the main circuit block to the plurality of bonding pads, for example extended from the main circuit block into the space between the bonding pads, and the plurality of second wires are electrically connected to the first wires. With this arrangement, it is possible to electrically connect the main circuit block and the sub-circuit block with ease.

Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENTS

A description will be made below of semiconductor integrated circuit devices according to preferred embodiment of the present invention.

First Embodiment

Figure 1:
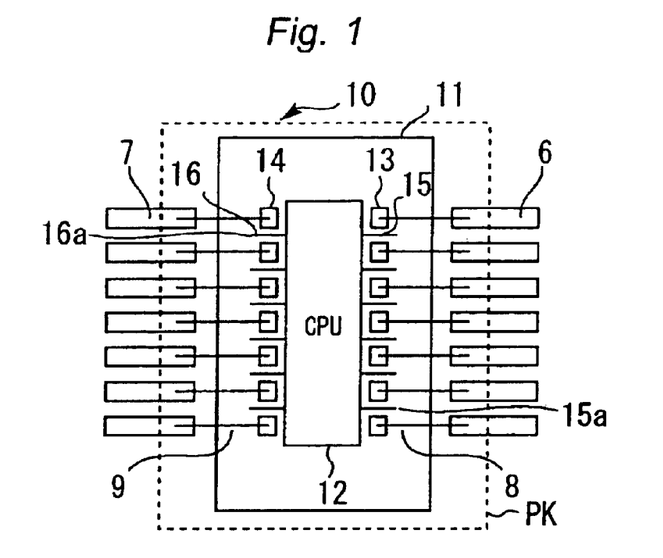
FIG. 1 shows a semiconductor integrated circuit device according to a first embodiment of the present invention.

FIG. 1 shows a semiconductor integrated circuit device according to a first embodiment of the present invention. In the figure, reference numeral 10 denotes the semiconductor integrated circuit device according to the first embodiment. The semiconductor integrated circuit device 10 is produced using a semiconductor substrate 11 made of silicon, etc. The semiconductor substrate 11 is rectangular with a main circuit block 12 formed at the center of its main surface. The main circuit of the main circuit block 12 is a processing unit (CPU) formed so as to have a substantially rectangular shape. The CPU 12 is composed of a large number of active circuit elements such as MOSFETs.

Pluralities of bonding pads 13 and 14 are formed around the right and left edges of the CPU 12. Specifically, in the figure, the bonding pads 13 and bonding pads 14 are vertically aligned along the right and left edges of the CPU 12, respectively, at intervals. The bonding pads 13 and bonding pads 14 are each connected to a respective circuit portion of the CPU 12 by internal wiring (not shown). The bonding pads 13 and bonding pads 14 are also connected through pluralities of internal leads 8 and 9 to pluralities of external leads 6 and 7 disposed around the semiconductor substrate 11, respectively, so as to cause the CPU 12 to perform predetermined operations. The external leads 6 and external leads 7 and the internal leads 8 and internal leads 9 are used to feed power source voltages and various input signals to the CPU 12 from the outside as well as supplying various signals from the CPU 12 to the outside. The number of bonding pads 13 and 14 necessary to provide all external connections for the CPU 12 are provided so that the CPU, 12 can execute all its functions. It should be noted that the package PK indicated by a broken line in FIG. 1 is used to seal the semiconductor substrate 11, the inner ends of the external leads 6 and external leads 7, and the internal leads 8 and internal leads 9. An example of the package PK is a resin package. The outer ends of the external leads 6 and external leads 7 are extracted from the package PK to the outside and used for external connection.

Pluralities of wires 15 and 16 are disposed at the right and left sides of the CPU 12, respectively. The plurality of wires 15 are extended from the CPU 12 to the right in parallel with one another and reach into the space between respective bonding pads 13 adjacent to them. Likewise, the plurality of wires 16 are extended from the CPU 12 to the left in parallel with one another and reach into the space between respective bonding pads 14 adjacent to them. The inner ends of the pluralities of wires 15 and 16 are each connected to a respective circuit portion of the CPU 12, while the tips 15a and tips 16a of their outer ends are extended through the space between neighboring bonding pads 13 and between neighboring bonding pads 14, respectively, and reach outside the bonding pads 13 and bonding pads 14. The pluralities of wires 15 and 16 are used to connect the CPU 12 to other sub-circuit blocks. In the first embodiment, however, since only the main circuit block (CPU) 12 is formed on the semiconductor substrate 11 (other sub-circuit blocks are not formed), the wires 15 and wires 16 are actually not used for connection.

In the first embodiment, the area of the semiconductor substrate 11 may be increased to provide space for forming other sub-circuit blocks on the right and left sides of the CPU 12, specifically, outside of both or one of the bonding pads 13 and bonding pads 14. The space can be used to form another or other sub-circuit blocks. If another sub-circuit block is formed in the space, the resultant semiconductor integrated circuit device is of type different from the type of the semiconductor integrated circuit device 10 even though it uses the configuration of the CPU 12 as it is. Furthermore, since the wires 15 and wires 16 have the tips 15a and tips 16a formed on their outer ends, the tips 15a and tips 16a can be easily overlapped on wires of another sub-circuit block in the process of forming the block, making it possible to easily form connections with another sub-circuit block.

Second Embodiment

Figure 2:
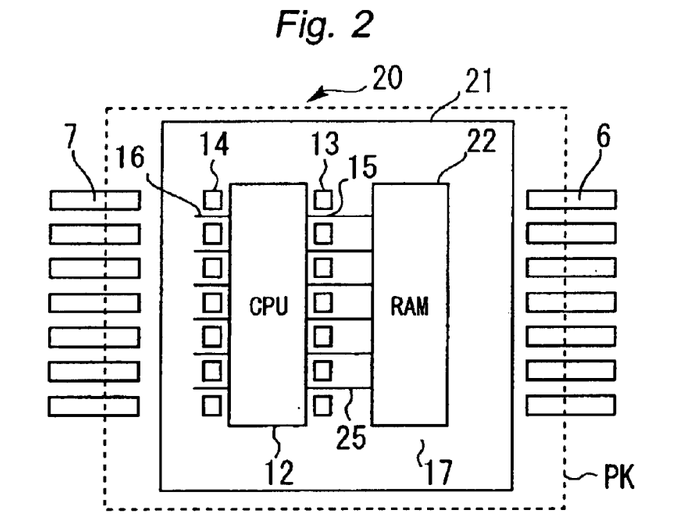
FIG. 2 shows a semiconductor integrated circuit device according to a second embodiment.

FIG. 2 shows a semiconductor integrated circuit device according to a second embodiment of the present invention. In the figure, reference numeral 20 denotes the semiconductor integrated circuit device according to the second embodiment. The semiconductor integrated circuit device 20 employs a semiconductor substrate 21 whose area is larger than the area of the semiconductor substrate 11 of the first embodiment. In the semiconductor integrated circuit device 20, a main circuit block 12 (that is, a CPU 12) which is the same as that employed by the first embodiment is formed on the left-hand side of the main surface of the semiconductor substrate 21 by use of the same process as that for the first embodiment. The CPU 12 has the same dimensions as those of the CPU 12 of the first embodiment. A space 17 is reserved on the right-hand side of the main surface. It should be noted that in FIG. 2, the internal leads 8 between the bonding pads 13 and the internal leads 9 between the bonding pads 14 and the external leads 6 and external leads 7 are omitted to simplify the drawing.

In the second embodiment, a sub-circuit block 22, which is a random access memory (RAM), is formed using the space 17 to the right of the CPU 12. Thus, the RAM 22 is formed in the space 17 on the right-hand side of the semiconductor substrate 21; specifically, it is formed on the right side of the bonding pads 13, which are disposed along the right edge of the CPU 12. In other words, the RAM 22 is formed in such a way that the RAM 22 and the CPU 12 sandwich the bonding pads 13 therebetween. The RAM 22 has a plurality of wires 25 extended to the left. The wires 25 are connected to a plurality of wires 15 extended from the CPU 12 to the right, providing interconnections between the CPU 12 and the RAM 22.

Figure 3:
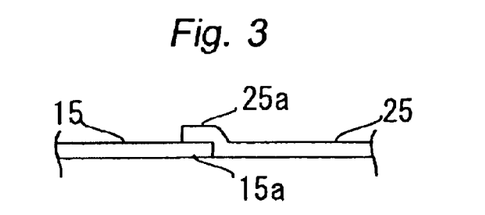
FIG. 3 is a cross-sectional view of the wires in the second embodiment.

Specifically, equal numbers of wires 25 and 15 are extended in parallel at the same pitch, and as shown in FIG. 3, they are arranged such that the tips 25a of the wires 25 are overlapped on the tips 15a of the wires 15. The overlapping of the tips 15a and tips 25a provides electrical connections between the wires 15 and wires 25. It should be noted that wires 16 are not used in the second embodiment.

As described above, the semiconductor integrated circuit device 20 of the second embodiment is another type of semiconductor integrated circuit device (as compared with the semiconductor integrated circuit device 10 of the first embodiment) in which the sub-circuit block (RAM) 22 is added to the main circuit block (CPU) 12. The semiconductor integrated circuit device 20 has a simple configuration in which the semiconductor substrate 21, whose area is larger than the area of the semiconductor substrate 11 of the first embodiment, is employed, and a CPU 12 which has the same dimensions as those of the CPU 12 of the first embodiment is formed on the main surface of the semiconductor substrate 21 using the same process as that for the first embodiment. The RAM 22 is formed in the space 17 on the semiconductor substrate 21. Furthermore, the interconnections between the CPU 12 and the RAM 22 can be easily made by overlapping the wires 15 and wires 25. This arrangement eliminates the need for newly developing the entire portion of the semiconductor integrated circuit device 20, resulting in reduced development and manufacturing cost. It should be noted that if the semiconductor integrated circuit device 20 is manufactured simply as a semiconductor memory device, the main circuit block 12 is used as a memory controller, instead of a processing unit CPU.

Third Embodiment

Figure 4:
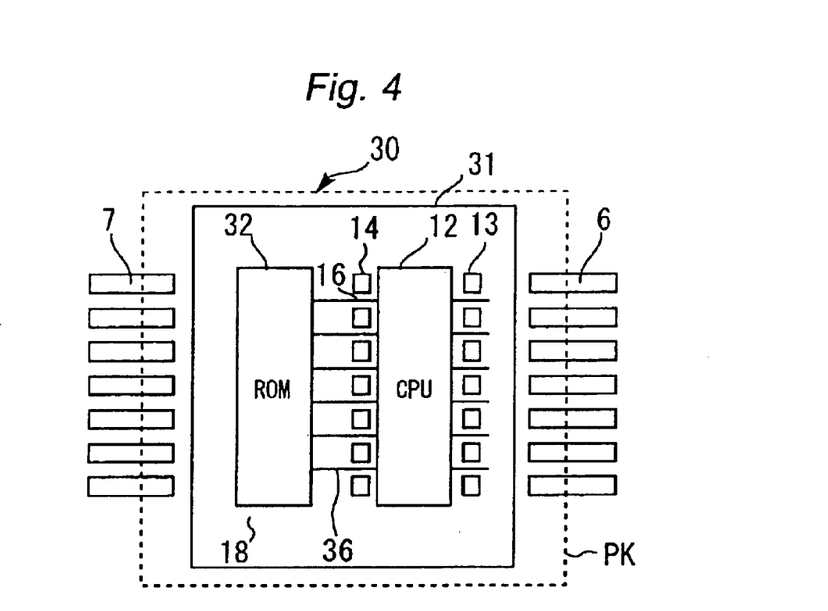
FIG. 4 shows a semiconductor integrated circuit device according to a third embodiment.

FIG. 4 shows a semiconductor integrated circuit device according to a third embodiment of the present invention. In the figure, reference numeral 30 denotes the semiconductor integrated circuit device according to the third embodiment. The semiconductor integrated circuit device 30 employs a semiconductor substrate 31 whose area is larger than the area of the semiconductor substrate 11 of the first embodiment. In the semiconductor integrated circuit device 30, a main circuit block 12 (that is a CPU 12) which is the same as that employed by the first embodiment is formed on the right-hand side of the main surface of the semiconductor substrate 31 by use of the same process as that for the first embodiment. The CPU 12 has the same dimensions as those of the CPU 12 of the first embodiment. A space 18 is reserved on the left-hand side of the main surface. It should be noted that also in FIG. 4, the internal leads 8 between the bonding pads 13, the internal leads 9 between the bonding pads 14, and the external leads 6 and external leads 7 are omitted to simplify the drawing.

In the third embodiment, a sub-circuit block 32, which is a read-only memory (ROM), is formed using the space 18. The ROM 32 is formed in the space 18 on the left-hand side of the semiconductor substrate 31; more specifically, it is formed on the left side of the bonding pads 14, which are disposed along the left edge of the CPU 12. In other words, the ROM 32 is formed in such a way that the ROM 32 and the CPU 12 sandwich the bonding pads 14 therebetween. The ROM 32 has a plurality of wires 36 extended to the right. The wires 36 are connected to a plurality of wires 16 extended from the CPU 12 to the left, providing interconnections between the CPU 12 and the ROM 32. It should be noted that wires 15 are not used in the third embodiment.

Figure 5:
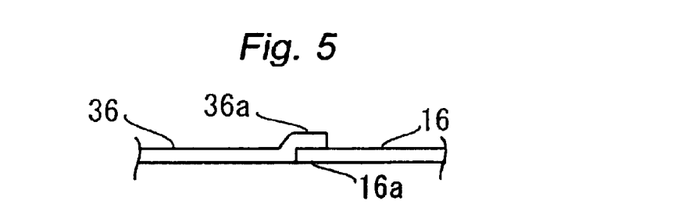
FIG. 5 is a cross-sectional view of the wires in the third embodiment.

Specifically, equal numbers of wires 36 and 16 are extended in parallel at the same pitch, and as shown in FIG. 5, they are arranged such that the tips 36a of the wires 36 are overlapped on the tips 16a of the wires 16. The overlapping of the tips 16a and 36a provides electrical connections between the wires 16 and wires 36.

As described above, the semiconductor integrated circuit device 30 of the third embodiment is another type of semiconductor integrated circuit device (as compared with the semiconductor integrated circuit device 10 of the first embodiment) in which the sub-circuit block (ROM) 32 is added to the main circuit block (CPU) 12. The semiconductor integrated circuit device 30 has a simple configuration in which the semiconductor substrate 31, whose area is larger than the area of the semiconductor substrate 11 of the first embodiment, is employed, and a CPU 12 which has the same dimensions as those of the CPU 12 of the first embodiment is formed on the main surface of the semiconductor substrate 31 using the same process as that for the first embodiment. The ROM 32 is formed in the space 18 on the semiconductor substrate 31. Furthermore, the interconnections between the CPU 12 and the ROM 32 can be easily made by overlapping the wires 16 and wires 36. This arrangement eliminates the need for newly developing the entire portion of the semiconductor integrated circuit device 30, resulting in reduced development and manufacturing cost.

Fourth Embodiment

Figure 6:
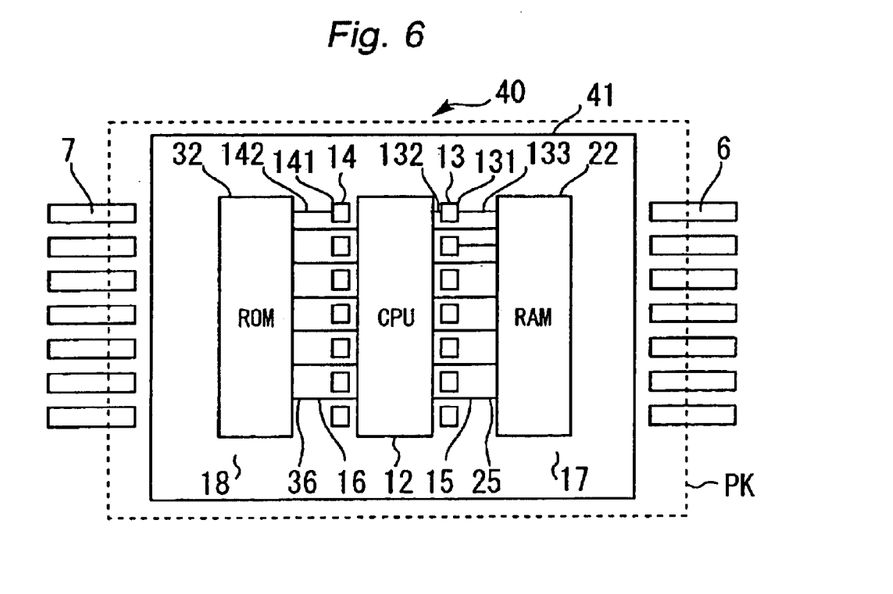
FIG. 6 shows a semiconductor integrated circuit device according to a fourth embodiment.

FIG. 6 shows a semiconductor integrated circuit device according to a fourth embodiment of the present invention. In the figure, reference numeral 40 denotes the semiconductor integrated circuit device according to the fourth embodiment. The semiconductor integrated circuit device 40 employs a semiconductor substrate 41 whose area is larger than the areas of the semiconductor substrates 21 and 31 of the second and third embodiments, respectively. A main circuit block 12 (that is a CPU 12) which is the same as that employed by the first embodiment is formed at the center of the main surface of the semiconductor substrate 41 by use of the same process as that for the first embodiment. The CPU 12 has the same dimensions as those of the CPU 12 of the first embodiment. Spaces 17 and 18 are reserved on the right and left sides of the CPU 12, respectively. It should be noted that also in FIG. 6, the internal leads 8 between the external leads 6 and the bonding pads 13 and the internal leads 9 between the bonding pads 14 and the external leads 7 are omitted to simplify the drawing.

In the fourth embodiment, a sub-circuit block 22, which is a random access memory (RAM), is formed using the space 17 on the semiconductor substrate 41. Furthermore, a sub-circuit block 32, which is a read-only memory (ROM), is formed using the space 18 on the semiconductor substrate 41. The RAM 22 is formed in the space 17 on the right-hand side of the semiconductor substrate 41; more specifically, it is formed on the right side of the bonding pads 13, which are disposed along the right edge of the CPU 12. The ROM 32, on the other hand, is formed in the space 18 on the left-hand side of the semiconductor substrate 41; more specifically, it is formed on the left side of the bonding pads 14, which are disposed along the left edge of the CPU 12. In other words, the RAM 22 and the ROM 32 are formed in such a way that the RAM 22 and the CPU 12 sandwich the bonding pads 13 therebetween, and the ROM 32 and the CPU 12 sandwich the bonding pads 14 therebetween. The RAM 22 and the ROM 32 have the same dimensions as those of the RAM 22 and the ROM 32 shown in FIGS. 2 and 4, and are formed using the same processes as those for the second and third embodiments, respectively. The RAM 22 has a plurality of wires 25 extended to the left. The wires 25 are connected to a plurality of wires 15 extended from the CPU 12 to the right, providing interconnections between the CPU 12 and the RAM 22. The ROM 32, on the other hand, has a plurality of wires 36 extended to the right. The wires 36 are connected to a plurality of wires 16 extended from the CPU 12 to the left, providing interconnections between the CPU 12 and the ROM 32.

Specifically, equal numbers of wires 25 and 15 are extended in parallel at the same pitch, and as shown in FIG. 3, they are arranged such that the tips 25a of the wires 25 are overlapped on the tips 15a of the wires 15. The overlapping of the tips 15a and 25a provides electrical connections between the wires 15 and wires 25. On the other hand, equal numbers of wires 36 and 16 are extended in parallel at the same pitch, and as shown in FIG. 5, they are arranged such that the tips 36a of the wires 36 are overlapped on the tips 16a of the wires 16. The overlapping of the tips 16a and 36a provides electrical connections between the wires 16 and wires 36.

As described above, the semiconductor integrated circuit device 40 of the fourth embodiment is another type of semiconductor integrated circuit device (as compared with the semiconductor integrated circuit device 10 of the first embodiment) in which the sub-circuit blocks RAM 22 and ROM 32 are added to the main circuit block CPU 12. The semiconductor integrated circuit device 40 has a simple configuration in which the semiconductor substrate 41, whose area is larger than the areas of the semiconductor substrates 21 and 31 of the first and second embodiment, is employed, and a CPU 12 which has the same dimensions as those of the CPU 12 of the first embodiment is formed on the main surface of the semiconductor substrate 41 using the same process as that for the first embodiment. The RAM 22 and the ROM 32, which are the same as the RAM 22 and the ROM 32 of the second and third embodiments, are formed in the spaces 17 and 18 on the semiconductor substrate 41. The interconnections between the CPU 12 and the RAM 22 can be easily made by overlapping the wires 15 and wires 25. Likewise, the interconnections between the CPU 12 and the ROM 32 can also be easily made by overlapping the wires 16 and wires 36. This arrangement eliminates the need for newly developing the entire portion of the semiconductor integrated circuit device 40, resulting in reduced development and manufacturing cost.

A description will be made below of the arrangement of the power source voltage supply pads. In FIG. 6, the top pad 131 among the bonding pads 13 is set to be the power source voltage supply pad for the main circuit block 12 and the sub-circuit block 22. Specifically, the pad 131 sandwiched by the main circuit block 12 and the sub-circuit block 22 is connected to the main circuit block 12 and the sub-circuit block 22 by way of power source voltage supply lines 132 and 133. The power source voltage supply lines 132 and 133 run in parallel with the wires 15 and wires 16 and are connected to the neighboring main circuit block 12 and the sub-circuit block 22. Such an arrangement of the power source voltage supply pad 131 and the power source voltage supply lines 132 and 133 is effective in avoiding improper arrangements such as that the power source voltage supply line for the sub-circuit block 22 runs through the main circuit block 12.

Further in FIG. 6, the top pad 141 among the bonding pads 14 is set to be the power source voltage supply pad for the sub-circuit block 32. The pad 141 is connected to the sub-circuit block 32 by the power source voltage supply line 142. The power source voltage supply line 142 runs in parallel with the wires 16 and wires 36 and is connected to the neighboring sub-circuit block 32. Thus, power is supplied to the sub-circuit block 32 from the pad 141 instead of the pad 131, reducing the length of the power source voltage supply line 142. Such an arrangement of the power source voltage supply pad 141 and the power source voltage supply line 142 is effective in avoiding improper arrangements such as that the power source voltage supply line for the sub-circuit block 32 runs through the main circuit block 12.

The above arrangement of the power source voltage supply pad 131 and the power source voltage supply lines 132 and 133 can be applied to the supply of a power source voltage to the main circuit block 12 and the sub-circuit block 32 in FIG. 6. The arrangement can also be applied to the second and third embodiments shown in FIGS. 2 and 4, respectively. Furthermore, the above arrangement of the power source voltage supply pad 141 and the power source voltage supply line 142 can be applied to the supply of a power source voltage to the main circuit block 12 and the sub-circuit block 22 in FIG. 6. The arrangement can also be applied to the second and third embodiments shown in FIGS. 2 and 4, respectively.

Fifth Embodiment

Figure 7:
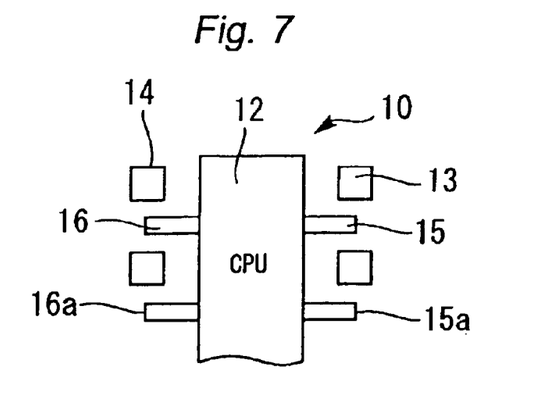
FIG. 7 is an enlarged view of a portion of a semiconductor integrated circuit device according to a fifth embodiment.

FIG. 7 is an enlarged view of a portion of a semiconductor integrated circuit device according to a fifth embodiment of the present invention. The fifth embodiment is a variation of the first embodiment shown in FIG. 1, wherein the lengths of the wires 15 and wires 16 are short as compared with the first embodiment. Even though the wires 15 and wires 16 are extended into the space between the bonding pads 13 and between the bonding pads 14, respectively, their tips 15a and tips 16a do not reach farther than the bonding pads 13 or bonding pads 14 (they remain inside the area between bonding pads 13 or the area between bonding pads 14) since the lengths of the wires 15 and wires 16 are short.

Sixth Embodiment

Figure 8:
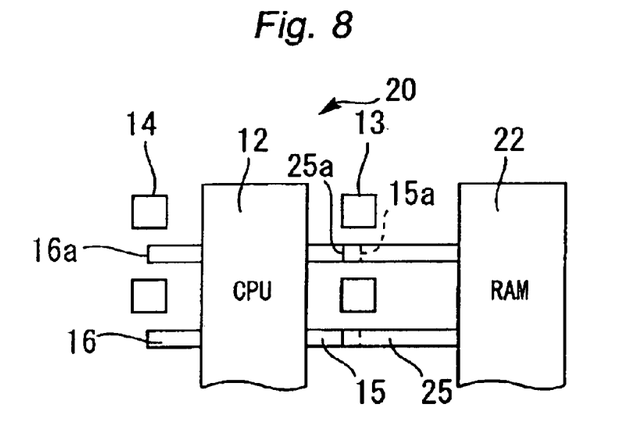
FIG. 8 is an enlarged view of a portion of a semiconductor integrated circuit device according to a sixth embodiment.

FIG. 8 is an enlarged view of a portion of a semiconductor integrated circuit device according to a sixth embodiment of the present invention. The sixth embodiment is a variation of the second embodiment shown in FIG. 2, wherein the lengths of the wires 15 and wires 16 are short as compared with the second embodiment. Even though the wires 15 and wires 16 are extended into the space between the bonding pads 13 and between the bonding pads 14, respectively, their tips 15a and tips 16a do not reach farther than the bonding pads 13 or bonding pads 14 (they remain inside the area between bonding pads 13 or the area between bonding pads 14) since the lengths of the wires 15 and wires 16 are short. Furthermore, the wires 25 from the RAM 22 are further extended, as compared with the second embodiment. The wires 25 are extended to such an extent that their tips 25a reach between the neighboring bonding pads 13, where the tips 25a overlaps the tips 15a of the wires 15.

Seventh Embodiment

Figure 9:
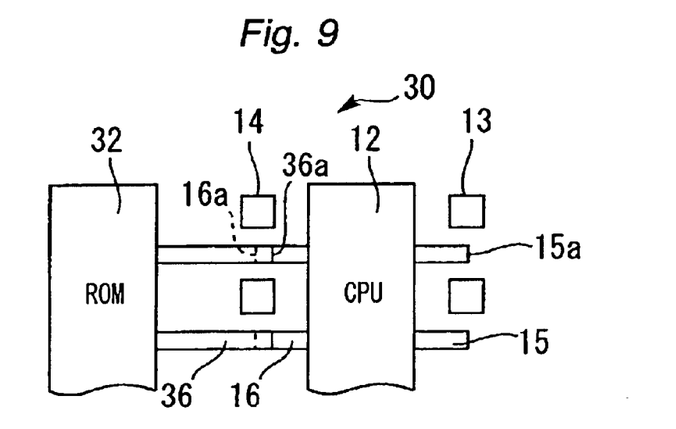
FIG. 9 is an enlarged view of a portion of a semiconductor integrated circuit device according to a seventh embodiment.

FIG. 9 is an enlarged view of a portion of a semiconductor integrated circuit device according to a seventh embodiment of the present invention. The seventh embodiment is a variation of the third embodiment shown in FIG. 4, wherein the lengths of the wires 15 and wires 16 are short as compared with the second embodiment. Even though the wires 15 and wires 16 are extended into the space between the bonding pads 13 and between the bonding pads 14, respectively, their tips 15a and tips 16a do not reach farther than the bonding pads 13 or bonding pads 14 (they remain inside the area between bonding pads 13 or the area between bonding pads 14) since the lengths of the wires 15 and wires 16 are short. Furthermore, the wires 36 from the ROM 32 are further extended, as compared with the third embodiment. The wires 36 are extended to such an extent that their tips 36a reach between the neighboring bonding pads 14, where the tips 36a overlaps the tips 16a of the wires 16.

According to the fifth, sixth, and seventh embodiments, the positions of the tips 15a and tips 16a of the wires 15 and wires 16 extended from the CPU 12 are set inside the area between bonding pads 13 or the area between bonding pads 14. Therefore, when the semiconductor substrates 11, 21, and 31 are cut off along dicing lines, no portions of the wires 15 and wires 16 are possibly cut, preventing occurrence of a short circuit in the semiconductor substrates due to the wire cuttings. Without the above arrangement, the wires 15 and wires 16 might be unintentionally cut when: the semiconductor substrate 11 is cut off at a position outside the bonding wires 13 and 14 in the first embodiment shown in FIG. 1; the semiconductor substrate 21 is cut off at a position to the left of the bonding pads 14 in the second embodiment shown in FIG. 2; or the semiconductor substrate 31 is cut off at a position to the right of the bonding pads 13 in the third embodiment shown in FIG. 4. However, if the positions of the tips 15a and tips 16a of the wires 15 and wires 16 are set between the bonding pads 13 and between the bonding pads 14, respectively, as in the fifth, sixth, and seventh embodiments, no portions of the wires 15 and wires 16 are possibly cut, preventing occurrence of a short circuit due to the wire cuttings.

Eighth Embodiment

Figure 10:
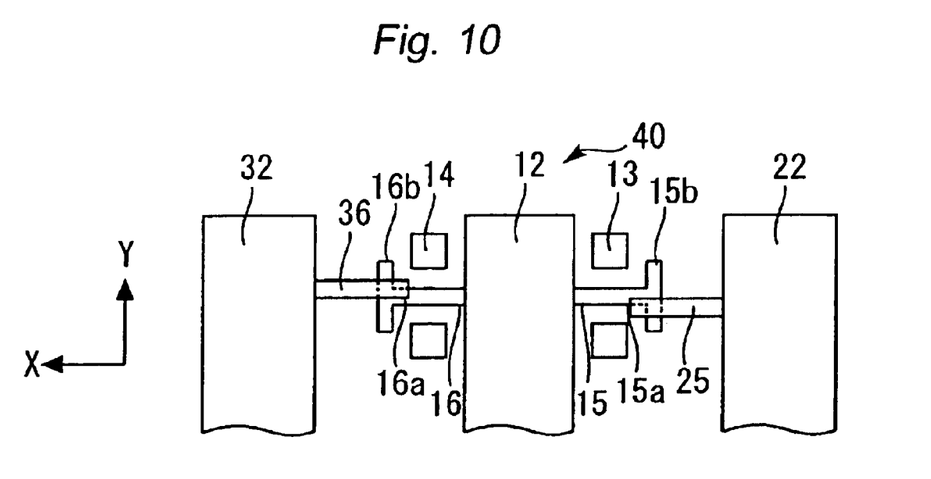
FIG. 10 shows a portion of a semiconductor integrated circuit device according to an eighth embodiment.

FIG. 10 shows a portion of a semiconductor integrated circuit device according to an eighth embodiment of the present invention. The eighth embodiment shown in FIG. 10 is a variation of the fourth embodiment shown in FIG. 4, wherein cross wire portions 15b and cross wire portions 16b are provided on the tips 15a and tips 16a of the wires 15 and wires 16 in such a way that the cross wire portions 15b and cross wire portions 16b intersect with the extended lines of the wires 15 and wires 16, respectively, at a right angle. The cross wire portions 15b and cross wire portions 16 are obtained as a result of forming the tips 15a and tips 16a in a T-shape. The configurations of the wires 15 and wires 16 according to the eighth embodiment can be applied to the first, second, and third embodiments.

Ninth Embodiment

Figure 11:
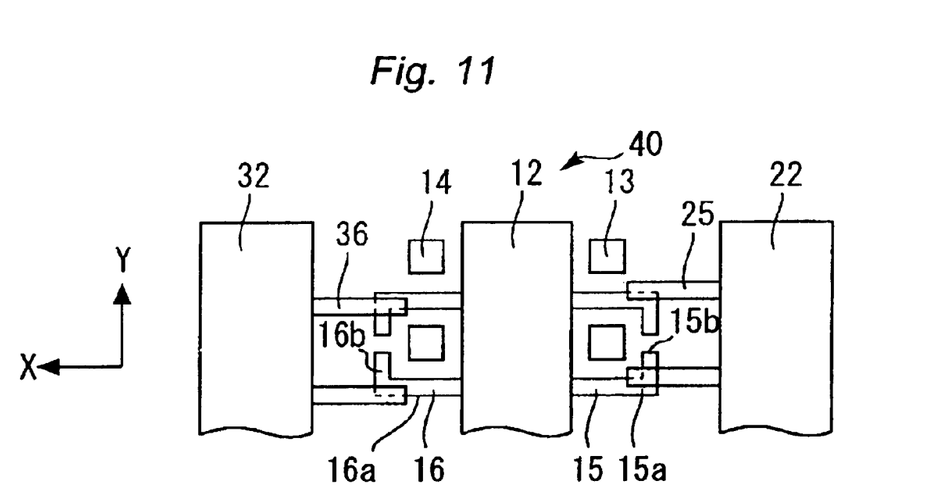
FIG. 11 shows a portion of a semiconductor integrated circuit device according to a ninth embodiment.

FIG. 11 shows a portion of a semiconductor integrated circuit device according to a ninth embodiment of the present invention. The ninth embodiment shown in FIG. 11 is also a variation of the fourth embodiment shown in FIG. 4, wherein cross wire portions 15b and cross wire portions 16b are provided on the tips 15a and tips 16a of the wires 15 and wires 16 in such a way that the cross wire portions 15b and cross wire portions 16b intersect with the extended lines of the wires 15 and wires 16, respectively, at a right angle. The cross wire portions 15b and cross wire portions 16b are obtained as a result of forming the tips 15a and tips 16a in an L-shape. The configurations of the wires 15 and wires 16 according to the ninth embodiment can also be applied to the first, second, and third embodiments.

The cross wire portions 15b and cross wire portions 16b according to the eighth and ninth embodiments make it possible to reliably overlap the wires 15 and the wires 25 as well as the wires 16 and the wires 36 even when the circuit blocks 22 and 32 are displaced a little with respect to the circuit block 12 in the Y-direction, and as a result, the wires 25 and wires 36 are also displaced a little in the same direction. It should be noted that the cross wire portions 15b and cross wire portions 16b are formed on the wires 15 and wires 16 of the CPU 12, and not on the wires 25 and wires 36 of the RAM 22 and ROM 32. If cross wire portions such as the cross wire portions 15b and cross wire portions 16b are provided on the wires 25 and wires 36 of the RAM 22 and ROM 32, the wires 15 and wires 16 might erroneously overlap the bonding pads 13 and bonding pads 14 and come into contact with them.

Tenth Embodiment

Figure 12:
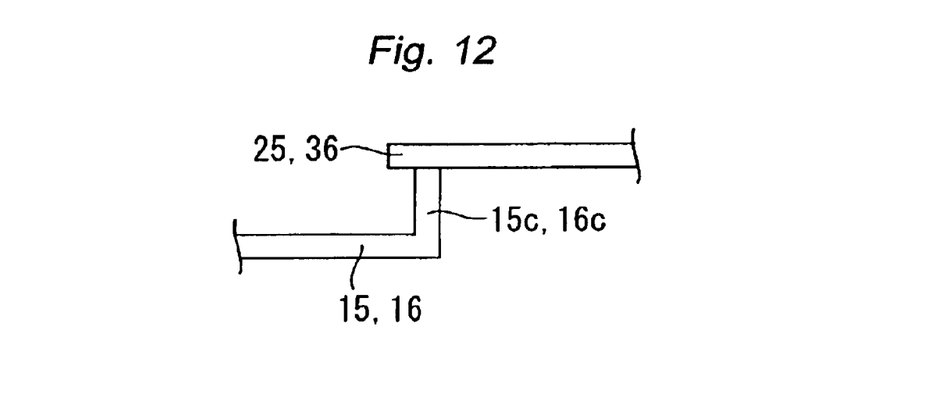
FIG. 12 shows a portion of a semiconductor integrated circuit device according to a tenth embodiment.

FIG. 12 shows a portion of a semiconductor integrated circuit device according to a tenth embodiment of the present invention. In the tenth embodiment, upright wire portions 15c and upright wire portions 16c perpendicular to the semiconductor substrates 11, 21, 31, and 41 are formed on the tips 15a and tips 16a of the wires 15 and wires 16, respectively. According to the tenth embodiment, the wires 25 and wires 36 are disposed on a plane different from the plane on which the wires 15 and wires 16 are disposed, and overlap the tips of the upright wire portions 15c and upright wire portions 16c, providing the electrical connections.

The configurations of the wires 15 and wires 16 according to the tenth embodiment can be applied to all of the first to ninth embodiments. The configuration of the wires 15 and wires 16 of the tenth embodiment is particularly effective in correcting the height displacement of the wires 25 and wires 36 of the sub-circuit blocks 22 and 32 with respect to the wires 15 and wires 16 of the main circuit block 12 on the main surface of the semiconductor substrates 11, 21, 31, and 41. That is, if the wires 25 and wires 36 are not on the same plane as the wires 15 and wires 16 are, the upright wire portions 15c and upright wire portions 16c may be added to easily connect them.

Methods for Manufacturing the Semiconductor Integrated Circuit

Figure 13:
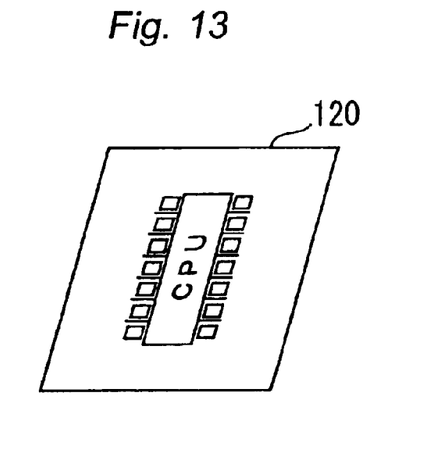
FIG. 13 shows a first mask prepared for a first circuit block (CPU)
Figure 14:
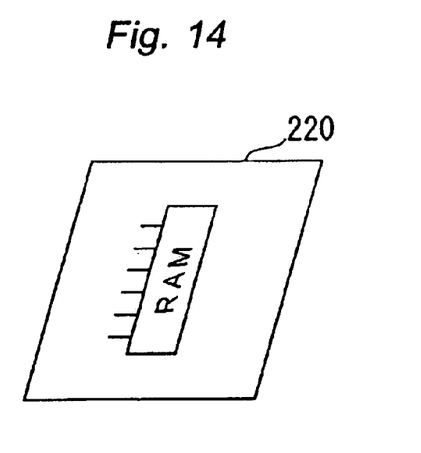
FIG. 14 shows a second mask prepared for a second circuit block (RAM)
Figure 15:
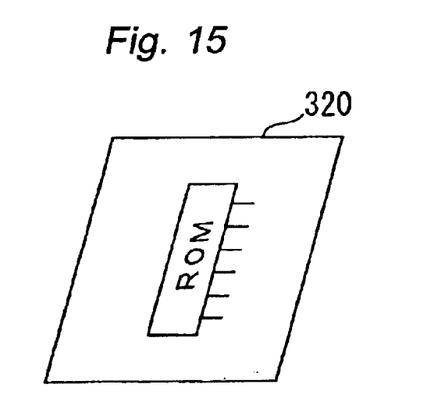
FIG. 15 shows a third mask prepared for a third circuit block (ROM)

A description will be made below of methods for manufacturing the semiconductor integrated circuit devices of the first to tenth embodiments. The manufacturing methods described below employ a plurality of masks, each prepared for a respective one of the circuit blocks 12, 22, and 32. FIG. 13 shows a first mask 120 prepared for the circuit block (CPU) 12; FIG. 14 shows a second mask 220 prepared for the circuit block (RAM) 22; and FIG. 15 shows a third mask 320 prepared for the circuit block (ROM) 32. Even though the masks 120, 220, 320 are each made up of a number of masks (sub-masks), they are shown as single masks (mask units) in the figure.

It should be noted that the first mask 120, the second mask 220, and the third mask 320 each have a mask pattern at their center portion because distortion is less likely to occur in the center portion than in the portions near the edges. With this arrangement, it is possible to enhance the precision of the photolithography as well as increasing the yield.

Figure 16:
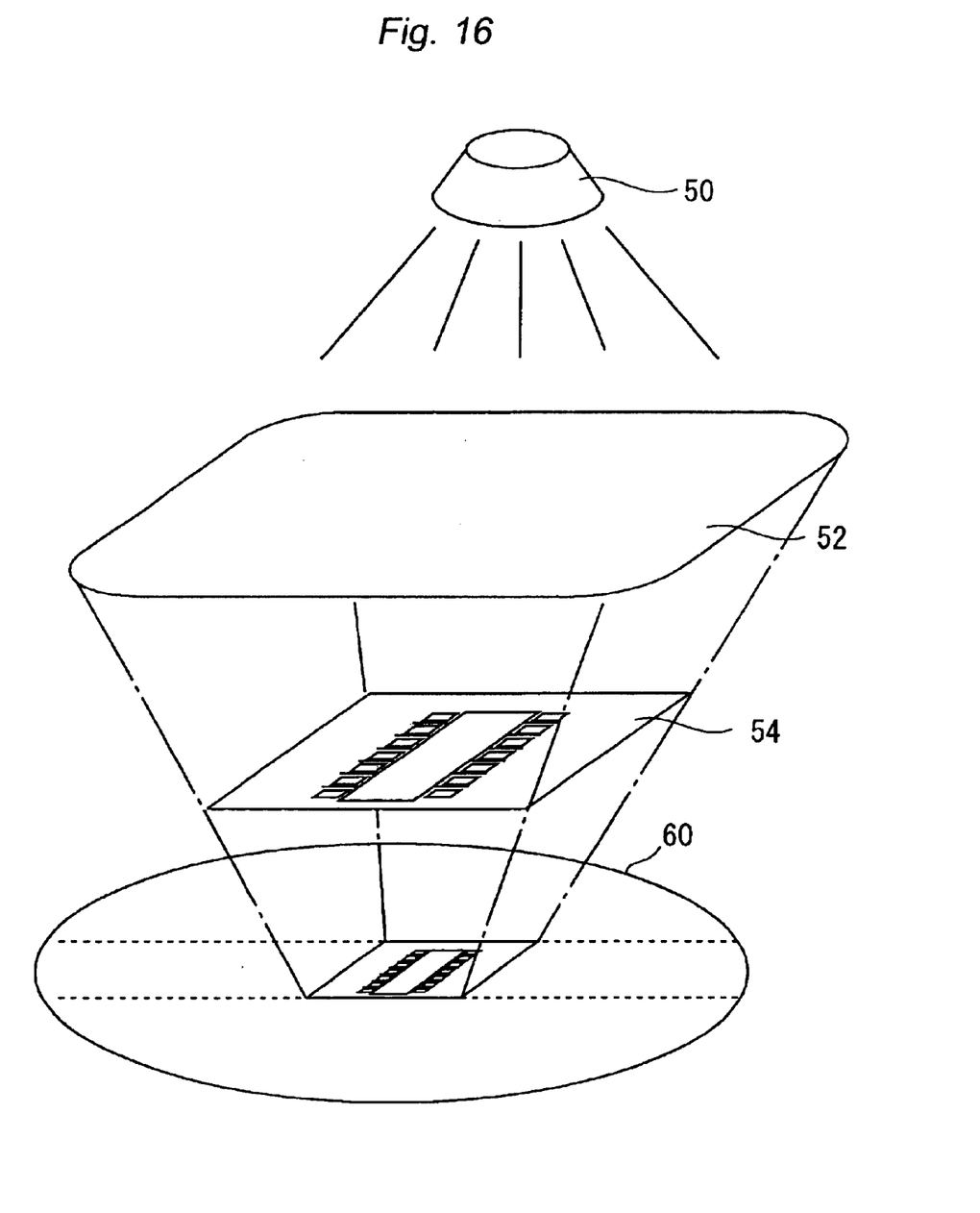
FIG. 16 shows a semiconductor stepper having an aligner.

A semiconductor stepper having an aligner as shown in FIG. 16 is used in the methods for manufacturing a semiconductor integrated circuit device. The aligner includes a light source 50, a converging lens 52, and a mask 54. One of the mask units 120, 220, and 320 is used as the mask 54. The image of the mask 54 is reduced and exposed onto a semiconductor wafer 60 by use of the converging lens 52. The semiconductor stepper transfers the semiconductor wafer 60 in a certain direction step by step to expose images of the mask 54 (which corresponds to the circuit block 12, 22, or 32) onto the semiconductor wafer 60 at predetermined intervals and thereby form the corresponding circuit blocks at the same intervals.

Figure 17:
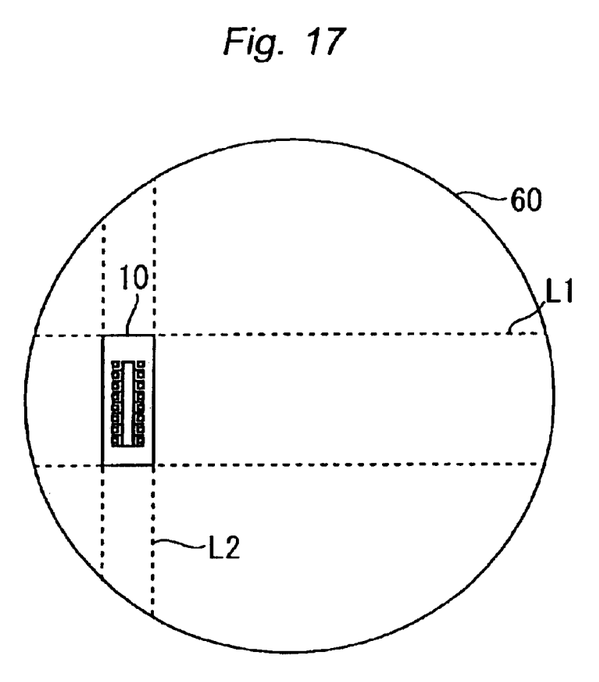
FIG. 17 illustrates formation of the semiconductor integrated circuit device of the first embodiment.

First, the method for manufacturing the semiconductor integrated circuit devices 10 of the first and fifth embodiments will be described. The mask unit 120 shown in FIG. 13 is used as the mask 54. As shown in FIG. 17, each main circuit block 12 is formed on the semiconductor wafer 60 at predetermined intervals together with bonding pads 13 and bonding pads 14 and the wires 15 and wires 16. Each individual semiconductor integrated circuit device 10 is obtained as a result of cutting the semiconductor wafer 60 along dicing lines L1 and L2.

Secondly, the method for manufacturing the semiconductor integrated circuit devices of the second, third, sixth, and seventh embodiments will be described, where both the main circuit block 12 and one of the sub-circuit blocks 22 and 32 are formed. In the method, the main circuit block 12 is first formed using the mask 120 in a fist process (the main circuit block manufacturing process) and then the sub-circuit block 22 or 32 is formed using the mask 220 or 320 in a second process (the sub-circuit block manufacturing process). Since the wires 25 or 36 are overlapped on the tips 15a or 16a of the wires 15 or 16, respectively, this manufacturing method can be applied to the eighth, ninth, and tenth embodiments.

The main circuit block manufacturing process first performs the steps of: forming a plurality of circuit elements making up the main circuit 12; covering the bonding pads 13 and bonding pads 14 with an insulation film, each pad connected to a respective circuit portion of these circuit elements; forming opening portions in the insulation film to expose the bonding pads 13 and bonding pads 14; and forming the wires 15 and wires 16 on the entire surface of the insulation film, each wire connected to a respective circuit portion of the main circuit block 12 (a wiring formation stage). After the main circuit block 12 has been manufactured up to the above wiring formation stage, the sub-circuit block manufacturing process is carried out.

The sub-circuit block 22 or 32 is formed in the space 17 or 18 on the semiconductor substrate 21 or 31, respectively, alongside the main circuit block 12. As the second process, the sub-circuit block manufacturing process first performs the steps of: forming a plurality of circuit elements making up the sub-circuit block 22 or 32; and forming a wiring layer used for forming the wires 25 or 36 on an insulation film covering the circuit elements, each wire connected to a respective circuit portion of the sub-circuit block 22 or 32 (a wiring layer formation stage). This wiring layer is formed such that it covers the entire surface of the insulation film on the sub-circuit block, and furthermore a portion of the wiring layer overlaps the tips 15a or 16a of the wires 15 or 16 formed in the first process. Subsequently, the wiring layer is patterned to form the wires 25 or 36 which partially overlap the tips 15a or 16a of the wires 15 or 16, respectively.

After the wires 15 and wires 16 and the wires 25 or 36 are formed, an insulation film covering the wires 15 and wires 16 is formed on the main circuit block 12, and an insulation film covering the wires 25 or 36 is formed on the sub-circuit block 22 or 32, thereby obtaining the semiconductor integrated circuit device 20 or 30 according to the second, third, sixth, or seventh embodiment.

Figure 18:
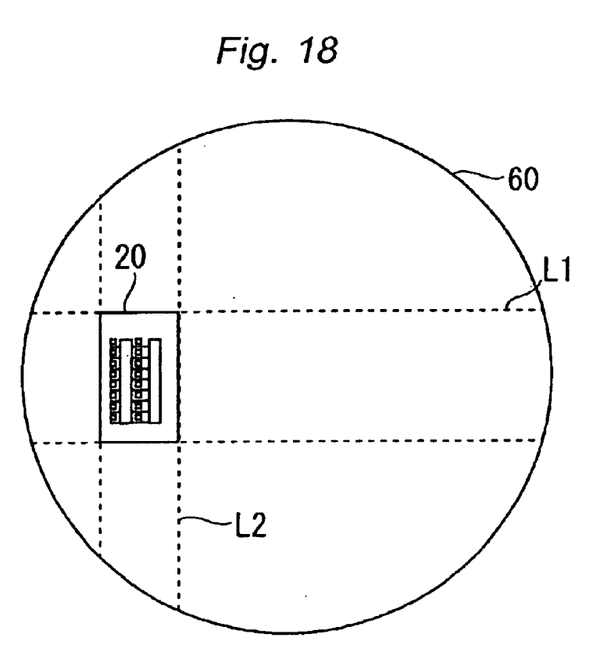
FIG. 18 illustrates formation of the semiconductor integrated circuit device of the second embodiment.

FIG. 18 illustrates formation of the semiconductor integrated circuit device 20 of the second embodiment on a semiconductor wafer 60. Each individual semiconductor integrated circuit device 20 is obtained as a result of cutting the wafer 60 along dicing lines L1 and L2.

The order in which the main circuit block manufacturing process and the sub-circuit block manufacturing process are performed maybe changed; specifically, firstly the sub-circuit block manufacturing process is carried out as a first process, and then the main circuit block manufacturing process is carried out as a second process. Since the tips 15a or 16a of the wires 15 or 16 are overlapped on the wires 25 or 36, respectively, this manufacturing process is applied to production of variations of the semiconductor integrated circuit devices 20 and 30 of the second, third, sixth, and seventh embodiments in which the wires 15 and wires 16 are overlapped on the wires 25 and wires 36.

In the process, the sub-circuit block 22 or 32 is formed in the space 17 or 18 on the semiconductor substrate 21 or 31, respectively, before the main circuit block 12 is formed. The sub-circuit block manufacturing process for forming the sub-circuit block 22 or 32 first performs the steps of: forming a plurality of circuit elements making up the sub-circuit block 22 or 32; and forming wires 25 or 36 on the insulation film covering the circuit elements, each wire connected to a respective circuit portion of the sub-circuit block (a wiring formation stage).

The subsequent main circuit block manufacturing process forms the main circuit block 12 alongside the sub-circuit block 22 or 32. The main circuit block manufacturing process first performs the steps of: forming a plurality of circuit elements making up the main circuit 12; covering the bonding pads 13 and bonding pads 14 with an insulation film, each pad connected to a respective circuit portion of these circuit elements; forming opening portions in the insulation film to expose the bonding pads 13 and bonding pads 14; and forming the wires 15 and wires 16 on the entire surface of the insulation film, each wire connected to a respective circuit portion of the main circuit 12 (a wiring layer formation stage). This wiring layer is formed such that it covers the entire surface of the insulation film on the main circuit block 12, and furthermore a portion of the wiring layer overlaps the wires 25 or 36 formed in the above first process. Subsequently, the wiring layer is patterned to form the wires 15 and wires 16 whose tips 15a and tips 16a overlap the wires 25 or 36.

After the wires 25 or 36 and the wires 15 and wires 16 are formed, an insulation film covering the wires 15 and wires 16 is formed on the main circuit block 12, and an insulation film covering the wires 25 or 36 is formed on the sub-circuit block 22 or 32, thereby obtaining a variation of the semiconductor integrated circuit device 20 or 30 according to the second, third, sixth, or seventh embodiment in which the wires 15 and wires 16 are overlapped on the wires 25 or 36.

Thirdly, the method for manufacturing the semiconductor integrated circuit devices 40 of the fourth, eighth, and ninth embodiments will be described. In the fourth, eighth, and ninth embodiments, the two sub-circuit blocks 22 and 32 are formed in addition to the main circuit block 12.

In one method, the circuit blocks are formed as follows. The main circuit block 12 is formed in a first process (the main circuit block manufacturing process); one of the sub-circuit blocks 22 and 32 is formed in a second process (a sub-circuit block manufacturing process); and the other one of the sub-circuit blocks 22 and 32 is formed in a third process (another sub-circuit block manufacturing process.)

The main circuit block manufacturing process and the two sub-circuit block manufacturing processes (for forming the sub-circuit blocks 22 and 32) are performed in the same way as they are performed in the method for manufacturing the devices 10.

In another method, for manufacturing the semiconductor integrated circuit devices 40 of the fourth, eighth, and ninth embodiments, the two sub-circuit blocks 22 and 32 are formed in addition to the main circuit block 12. The circuit blocks are formed as follows. One of the sub-circuit blocks 22 and 32 is formed in a first process (a sub-circuit block manufacturing process); the other one of the sub-circuit blocks 22 and 32 in a second process (another sub-circuit block manufacturing process); and lastly the main circuit block 12 is formed in a third process (the main circuit block manufacturing process.)

In the method, the main circuit block manufacturing process is performed in the same way as it is performed in the twelfth embodiment. Furthermore, the two sub-circuit block manufacturing processes (for forming the sub-circuit blocks 22 and 32) are performed in the same way as they are performed in the thirteenth embodiment. The main circuit block manufacturing process for forming the main circuit block 12 is performed in the same way as it is performed in the thirteenth embodiment. It goes without saying that the main circuit block 12 is formed between the sub-circuit blocks 22 and 23, and the wires 15 and wires 16 are overlapped on the wires 25 and wires 36.

These methods described above make it possible to add circuit blocks as necessary, forming them alongside of one another, and thereby easily manufacture semiconductor integrated circuit devices of different types. Furthermore, the electrical interconnections between two or more circuit blocks can be easily provided in the main circuit block manufacturing process and the sub-circuit circuit block manufacturing process.

The above embodiments assume that the main circuit block 12 is a processing unit (CPU), and the sub-circuit blocks 22 and 32 are a random access memory (RAM) and a read-only memory (ROM), respectively. However, the main circuit block 12 may be a memory control circuit, and the sub-circuit blocks 22 and 32 each may be, for example, a random access memory having 4 Mbytes. In this case, one or two random access memories are controlled by a common memory control circuit. Further, the main circuit block 12 may be an A/D converter, and the sub-circuit blocks 22 and 32 may be used as D/A converters. Conversely, the main circuit block 12 may be a D/A converter, and the sub-circuit blocks 22 and 32 may be used as A/D converters.

According to the present invention, it is possible to easily manufacture a semiconductor integrated circuit device by utilizing at least one circuit block and its bonding pads and first wires employed another type of semiconductor integrated circuit device having at least one circuit block.

Further according to the present invention, it is possible to easily manufacture a semiconductor integrated circuit device by employing a sub-circuit block and a main circuit block common to another type of semiconductor integrated circuit device, forming these blocks alongside of each other on the main surface of a semiconductor substrate. This arrangement also makes it possible to easily provide the electrical connection between the main circuit block and the sub-circuit block.

Still further according to the present invention, a main circuit block and a sub-circuit block can be formed on the main surface of a single semiconductor substrate alongside of each other with a distance therebetween in the main circuit block manufacturing process and the sub-circuit block manufacturing process, which makes it possible to easily obtain semiconductor integrated circuit devices of different types using a common main circuit block as well as easily providing the electrical connection between their first and second wires.

It is further understood that the foregoing description is a preferred embodiment of the disclosed devices and that various changes and modifications may be made in the invention without departing from the spirit and scope thereof.

The entire disclosure of a Japanese Patent Application No.2002-149671, filed on May 23, 2002 including specification, claims drawings and summary, on which the Convention priority of the present application is based, are incorporated herein by reference in its entirety.

What is claimed is:

1. A semiconductor integrated circuit device comprising:
   a semiconductor substrate;
   a circuit block on the substrate;
   a plurality of bonding pads disposed around the circuit block, and being connected to external leads of the semiconductor integrated circuit device; and
   a plurality of wires extending from the circuit block between, but not in contact with, the bonding pads, each wire having a shape connectable to another wire.

2. The semiconductor integrated circuit device as claimed in claim 1, wherein the wire has a tip having a shape connectable to another wire.

3. The semiconductor integrated circuit device as claimed in claim 2, wherein the tip of the wire has a portion perpendicular to the semiconductor substrate.

4. The semiconductor integrated circuit device as claimed in claim 2, wherein the tip of the wire is positioned between, but not in contact with, the bonding pads.

5. The semiconductor integrated circuit device as claimed in claim 2, wherein the tip of the wire has a cross-wire portion which intersects with an extended line of the wire.

6. A semiconductor integrated circuit device comprising:
   a semiconductor substrate;
   a main circuit block and a sub-circuit block disposed alongside of each other with a distance therebetween on the substrate;
   a plurality of bonding pads disposed between the main circuit block and the sub-circuit block, and being connected to external leads of the semiconductor integrated circuit device;
   a plurality of first wires extending in a direction from the main circuit block to the plurality of bonding pads; and
   a plurality of second wires extending from the sub-circuit block and each electrically connected to one of the first wires.

7. A semiconductor integrated circuit device comprising:

a semiconductor substrate;

a main circuit block and a sub-circuit block disposed alongside of each other with a distance therebetween on the substrate;

a plurality of bonding pads disposed between the main circuit block and the sub-circuit block, and being connected to external leads of the semiconductor integrated circuit device;

a plurality of first wires extending from the main circuit block between, but not in contact with, the plurality of bonding pads; and a plurality of second wires extending from the sub-circuit block and each electrically connected to one of the first wires.

8. The semiconductor integrated circuit device as claimed in claim 7, wherein the first wire has a tip having a shape connectable to the second wire.

9. The semiconductor integrated circuit device as claimed in claim 8, wherein the tip of the first or second wire has a portion perpendicular to the semiconductor substrate.

10. The semiconductor integrated circuit device as claimed in claim 8, wherein the tip of the first wire is positioned between, but not in contact with, the bonding pads.

11. The semiconductor integrated circuit device as claimed in claim 8, wherein the tip of the first or second wire has a cross-wire portion which intersects with an extended line of the wire.

12. The semiconductor integrated circuit device as claimed in claim 8, wherein the first wires and the second wires are disposed on a same layer, and each second wire is overlapped on one of the tips of the first wires in such a way that the second wire is electrically connected to the first wire.

13. The semiconductor integrated circuit device as claimed in claim 9, wherein the first wires and the second wires are respectively disposed on different layers, and each second wire is electrically connected to one of the first wires through the perpendicular portion.

14. The semiconductor integrated circuit device as claimed in claim 7, wherein the plurality of bonding pads include a power supply pad for supplying a power source voltage to the main circuit block and the sub-circuit block.

15. The semiconductor integrated circuit device as claimed in claim 7, wherein the plurality of bonding pads include a power supply pad for supplying a power source voltage to the sub-circuit block.

* * * * *